(12) United States Patent
Lee

(10) Patent No.: US 6,794,212 B2
(45) Date of Patent: Sep. 21, 2004

(54) METHOD AND APPARATUS FOR FABRICATING A THIN FILM BULK ACOUSTIC RESONATOR

(75) Inventor: Chwan-Ying Lee, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 3 days.

(21) Appl. No.: 10/180,111

(22) Filed: Jun. 27, 2002

(65) Prior Publication Data

US 2003/0003612 A1 Jan. 2, 2003

(30) Foreign Application Priority Data

Jun. 28, 2001 (TW) .......................... 90115711 A

(51) Int. Cl.⁷ ............................................. H01L 21/00
(52) U.S. Cl. ........................... 438/48; 438/34; 438/735
(58) Field of Search ............................. 438/34, 48, 735

(56) References Cited

U.S. PATENT DOCUMENTS

| | | | | |
|---|---|---|---|---|
| 5,714,917 A | * | 2/1998 | Ella | 332/144 |
| 5,853,601 A | * | 12/1998 | Krishaswamy et al. | 216/2 |
| 2003/0030118 A1 | * | 2/2003 | Kim | 257/414 |
| 2003/0088960 A1 | * | 5/2003 | Seo et al. | 29/25.35 |

* cited by examiner

*Primary Examiner*—Alexander Ghyka
(74) *Attorney, Agent, or Firm*—Rabin & Berdo, P.C.

(57) ABSTRACT

A method for fabricating a thin film bulk acoustic resonator (FBAR) is able to simplify the conventional fabricating step. Particularly, a chamber is defined between a substrate and of the resonator without need for a polishing processes and filling processes. Therefore, the present invention is able to have a high fabricating ability, a high production rate and a short fabricating time.

7 Claims, 6 Drawing Sheets

METHOD AND APPARATUS FOR FABRICATING A THIN FILM BULK ACOUSTIC RESONATOR

BACKGROUND OF THE INVENTION

1. Field of the Invention

The present invention relates to a method for fabricating a thin film bulk acoustic resonator (FBAR) which may be used as a filter used for electronic circuits and more particularly to the method having simple steps to fabricate the FBAR, besides having high production ability of the FBAR.

2. Description of Related Art

The high frequency and exact resonance frequency of the FBAR are important elements when fabricating the FBAR. The earlier generation SAW (surface acoustic wave) fabricating method of a resonator employed a pair of parallel fingers on a surface of a substrate. To fabricate a high frequency by the conventional method, a distance of the two adjacent metal fingers has to be reduced. For example, a resonator having 2 GHz frequency is able to use a semiconductor process with less than 0.5 $\mu$m. Therefore, fabricating the high frequency resonator is costly and owing to use the surface acoustic property. The power handling is another major limitation for high performance wireless product.

A present resonator adopting the surface acoustic wave theory is able to solve the above drawbacks incurred in the conventional processing of the resonator. The resonator is fabricated according to the surface acoustic wave theory to have a high frequency and high power factor. That is, a direction of the acoustic wave of the resonator and a surface of the resonator are perpendicular to each other, whereby the resonator needs a relationship of some important elements such as the piezoelectric material and the working frequency of the resonator are inverse proportion to each other, to fabricate an FBAR.

With reference to FIGS. 6A to 6E, a conventional fabricating method of a thin film bulk acoustic resonator (FBAR) is shown. The method for fabricating the resonator comprises the following steps:

defining a recess (501) in a top face of a Si substrate (50) and then applying a SiO$_2$ layer (51) on the top face of the Si substrate;

applying a phosphorsilica glass layer (52) on the SiO$_2$ layer (51);

chemical machine polishing the phosphorsilica glass layer (52) to have a portion of the phosphorsilica glass layer (52) remained in the recess (501);

sequentially forming a first conductive layer (53), a piezoelectric material layer (55) and a second conductive layer (54) on the phosphorsilica glass layer (52) remained in the recess (501); and etching away the phosphorsilica glass layer (52) to expose the recess (501).

As per the above steps, a resonator is formed on the recess (501), that is, after the phosphorsilica glass layer (52) is etched, the body of the resonator is supported by the edge of the recess (501). However, the substrate (50) corresponding to the body of the resonator has to define the recess (501) for having high frequency filtering ability, so that, before forming the body of the resonator, the recess (501) has to undergo filling and polishing steps. Therefore, the above complex steps are necessary for the conventional resonator to be able to have high frequency and high power factor, and thus fabricating the FBAR not only takes considerable time but also has a slow production rate.

To overcome those shortcomings, the present invention provides simple and easy steps and good production ability to mitigate and obviate the aforementioned problems.

SUMMARY OF THE INVENTION

The objective of the present invention is able to provide a simple method for fabricating thin film bulk acoustic resonators (FBAR), and furthermore, the fabrication method of the FBAR does not need a chemical machine polishing (CMP) step. The method for fabricating FBAR comprises the following steps:

preparing a Si substrate;

applying an insulating layer on the Si substrate;

sequentially applying a first conductive layer, a piezoelectric material layer and a second conductive layer on top of the Si substrate;

partially etching the second conductive layer and the piezoelectric material layer to form an upper electrode and a piezoelectric layer; and defining holes in the first conductive layer by etching so as to allow the formation of a chamber under the first conductive layer.

Therefore, fabricating the FBAR requires only a short working time, and the production rate of the FBAR is accordingly high.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
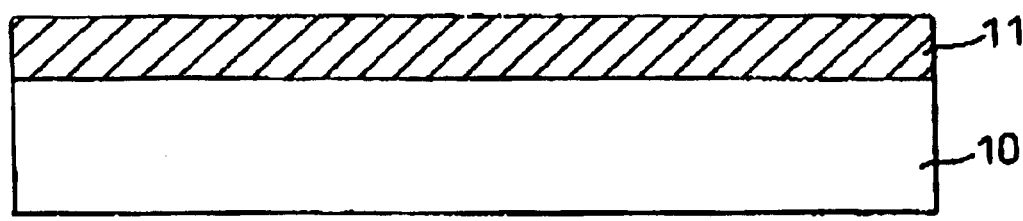
FIG. 1 is a cross section view of making an insulating layer step of the method in accordance with the present invention.
Figure 2:
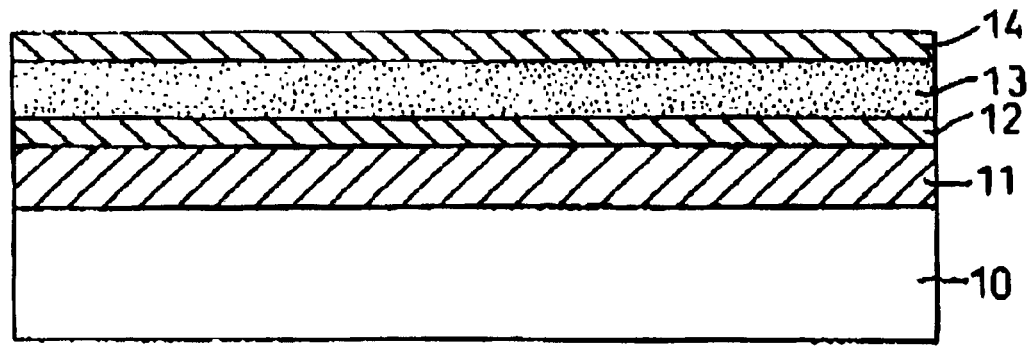
FIG. 2 is a cross section view of making three elements on the insulating layer step of the method in accordance with the present invention.
Figure 3A:
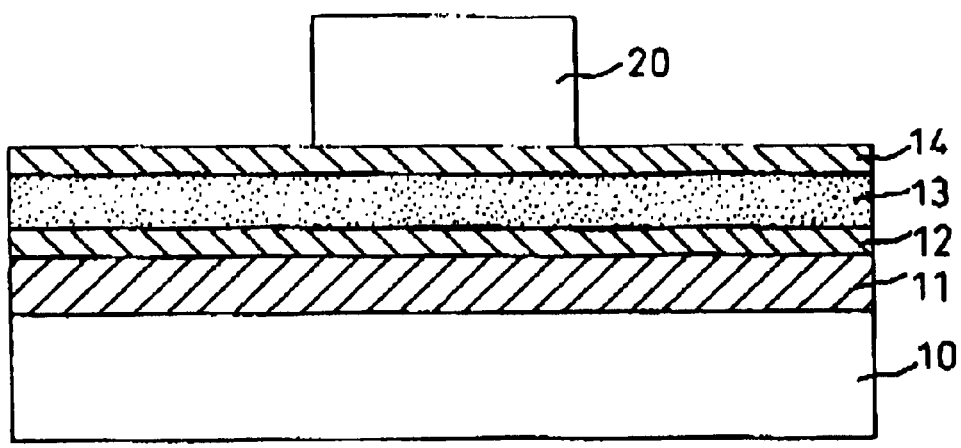
FIGS. 3A~3C are two cross section views of making an upper body of a resonator step of the method in accordance with the present invention.
Figure 3B:
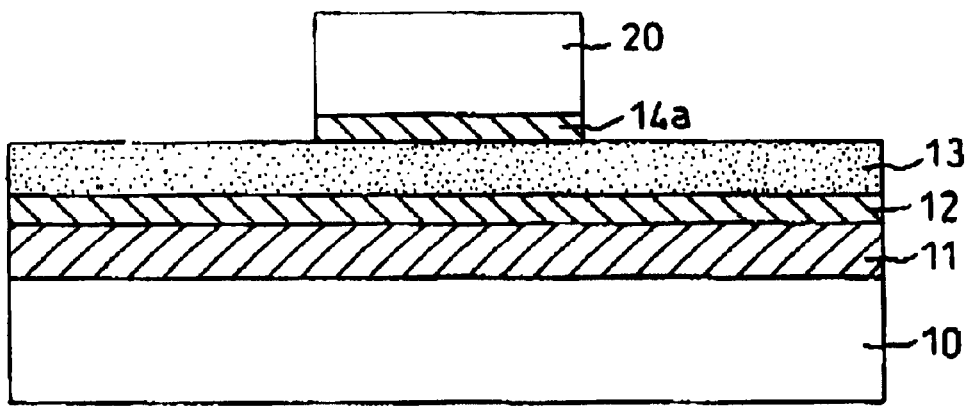
Figure 3C:
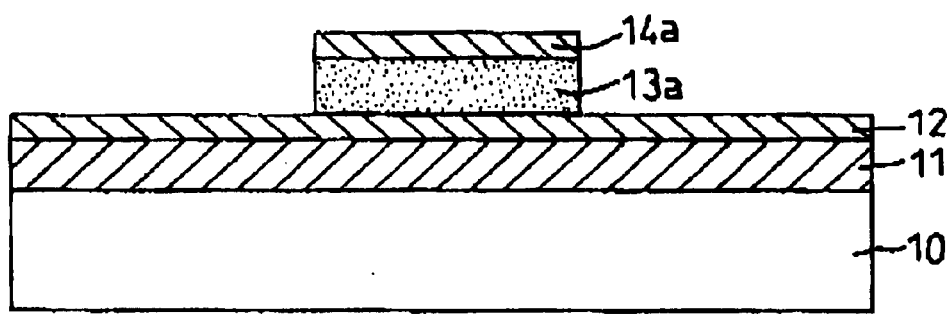
Figure 4A:
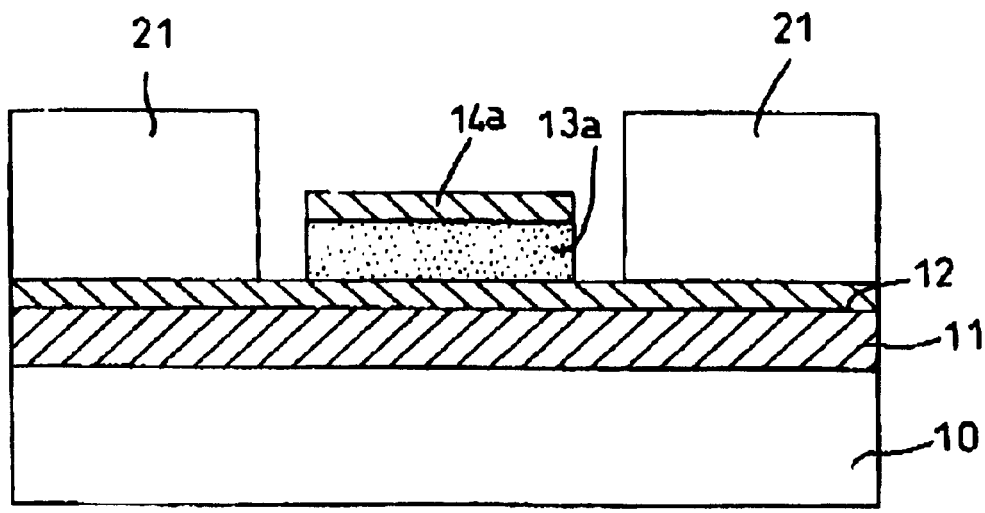
FIGS. 4A~4C are three cross section views of making a chamber defining between the substrate and the first metal layer step of the method in accordance with the present invention.
Figure 4B:
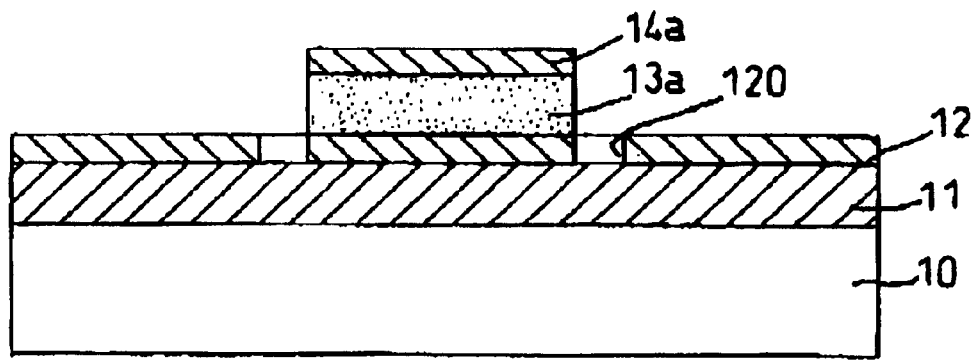
Figure 4C:
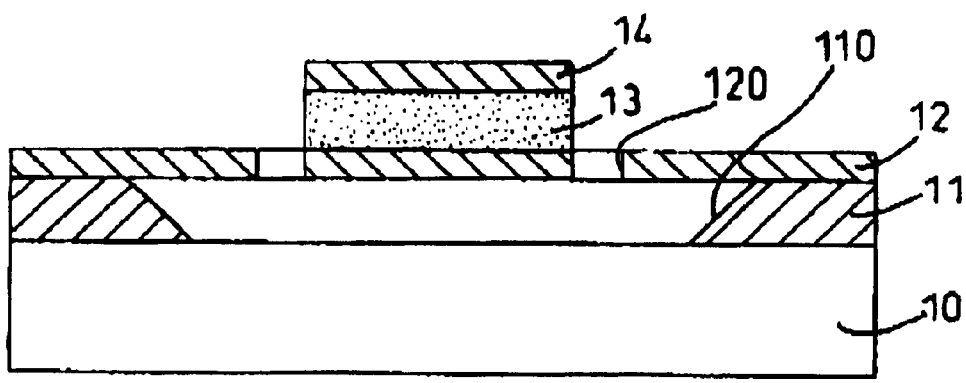
Figure 5A:
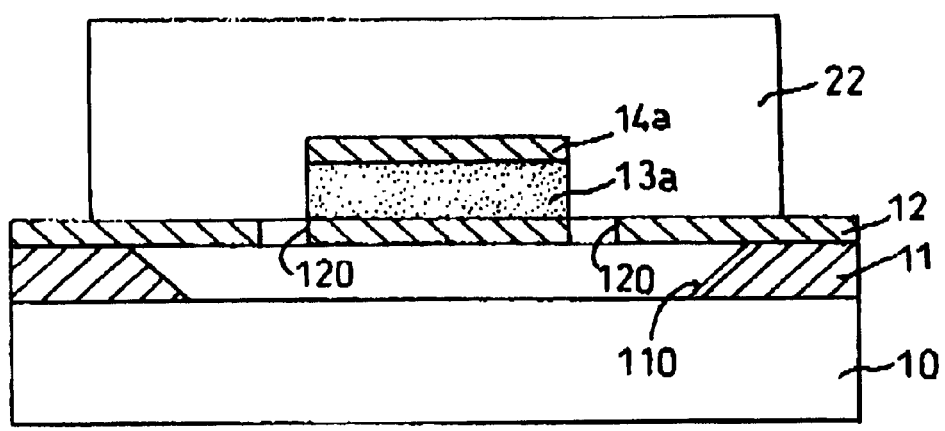
FIGS. 5A and 5B are cross section views of making a lower body of the resonator step of the method in accordance with the present invention.
Figure 5B:
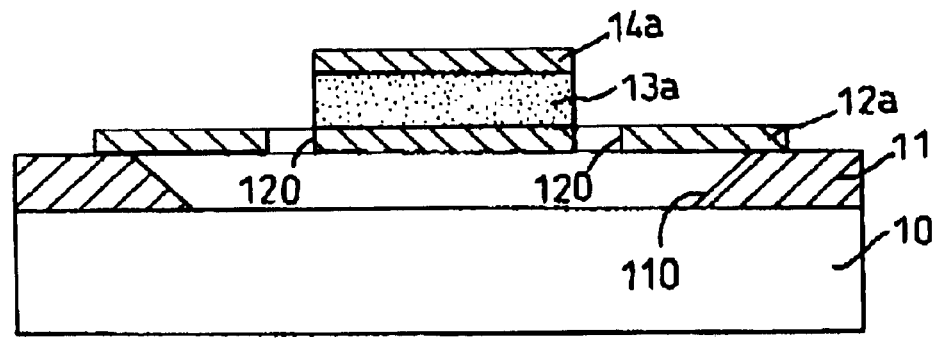
Figure 6A:
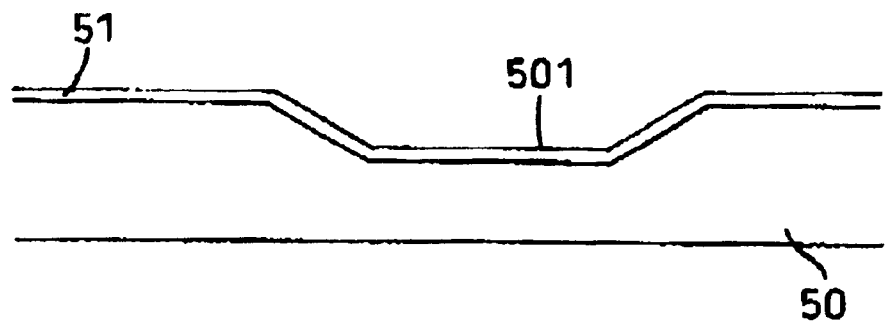
FIGS. 6A~6E are cross section views of the conventional steps of fabricating an FBAR.
Figure 6B:
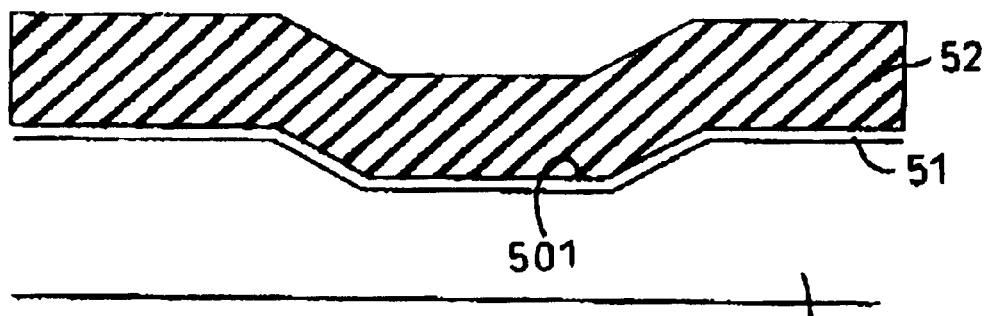
Figure 6C:
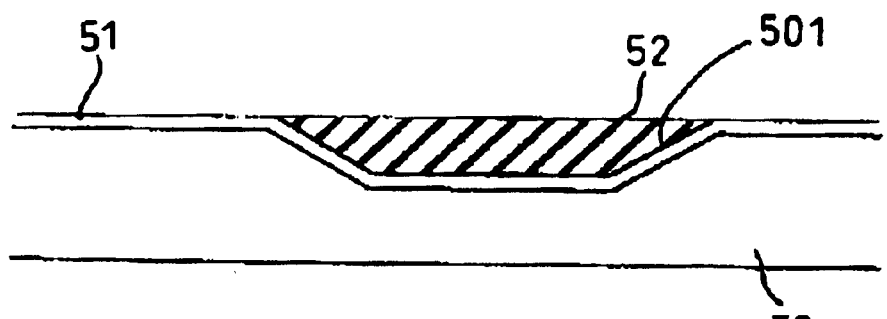
Figure 6D:
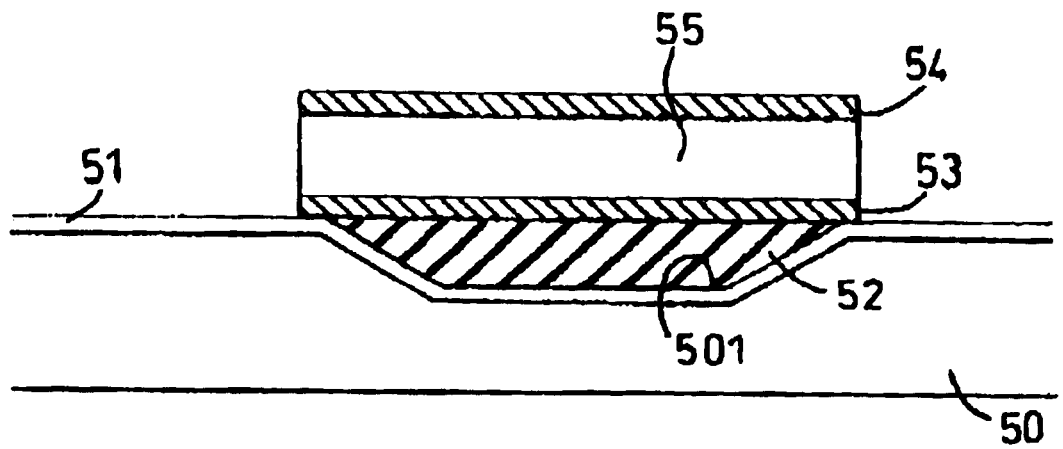
Figure 6E:
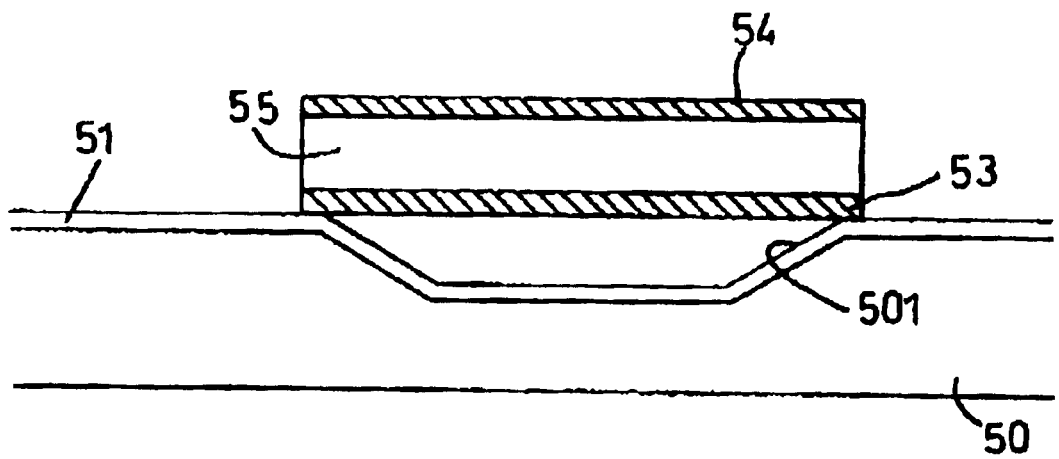

With reference to FIGS. 1 and 2, the method for fabricating a thin film bulk acoustic resonator comprises the following steps:

preparing a Si substrate (10);

applying an insulating layer (11) on the Si substrate (10), wherein a thickness of the insulating layer (11) is 1000~10000 angstrom;

applying a first conductive layer (12) on the insulating layer (11), wherein a thickness of the first conductive layer (12) is 1000~10000 angstrom;

applying a piezoelectric material layer (13) on the first conductive layer (12), and a thickness of the piezoelectric material layer (13), such as an AlN and a ZnO, is 0.5~5 $\mu$m;

applying a second conductive layer (14) on the piezoelectric material layer (13) wherein a thickness of the second conductive layer (14) is 1000~10000 angstrom;

forming a first photo-resistant layer (20) on the second conductive layer (14), as shown in FIG. 3A;

etching the second conductive layer (14) to leave the second conductive layer (14) covered by the first photo-resistant layer (20) on the piezoelectric material layer (13) to form an upper electrode (14a) of the resonator, as shown in FIG. 3B;

etching the piezoelectric material layer (13) to leave the piezoelectric material layer (13) covered by first photo-resistant layer (20) and the upper electrode (14a) on the first conductive layer (12) and then removing the first resistant layer (20) to form a piezoelectric layer (13a) of the resonator, as shown in FIG. 3C;

forming a second photo-resistant layer (21) on the first conductive layer (12), as shown in FIG. 4A;

etching the first conductive layer (12) to leave the first conductive layer (12) covered by the second photo-resistant layer (21) on the insulating layer (11) to define multiple through holes (120) in the first conductive metal layer (12), as shown in FIG. 4B;

etching the insulating layer (11) through the multiple through holes (120) to defined a chamber (110) under the first conductive layer (12), as shown in FIG. 4C;

forming a third photo-resistant layer (22) on the first conductive layer (12), as shown FIG. 5A; and etching the first conductive layer (12) to leave the first conductive layer (12) covered by the third photo-resistant layer (22), and then removing the third photo-resistant layer (22) to form the lower electrode (12a) of the resonator, as shown FIG. 5B.

The chamber (110) is defined between the resonator and the substrate (10) after forming the upper and lower electrode (12a, 14a) and the piezoelectric layer (13a) of the resonator for supporting the resonator without undergoing the filling and the polishing steps, so that the method has simple fabricating processes and a short working time With reference to FIG. 5B, the body of the resonator supported on the substrate (10) comprises the substrate (10), at least two insulating layers (11) formed on an upper surface of the substrate (10), at least one lower electrode (12a) formed on the two adjacent insulating layers (11), at least one piezoelectric layer (13a) corresponded to form on each lower electrode (12a), and at least one upper electrode (14a) formed on the piezoelectric layer (13a). In order to support the resonator the lower electrode (12a) is larger than the upper electrode (14a), however the upper and lower electrodes otherwise have the same characteristics.

As per the above description about the invention, the method has simple processes to fabricate the FBAR, especially, the chamber defined after forming the all amounts of the resonator. Therefore, the method does not use CMP processes, and the filling processes to forming the chamber, so that the present method has the following advantages:

1. Simple steps of method for fabricating the FBAR;
2. Reduction of the fabricating time in comparison to the conventional method; and
3. Increase in the production of fabrication the FBAR in comparison to the conventional method.

Although the present invention has been explained in relation to its preferred embodiment, it is to be understood that many other possible modifications and variations can be made without departing from the spirit and scope of the invention as hereinafter claimed.

What is claimed is:

1. A method for fabricating a thin film bulk acoustic resonator (FBAR), comprising the following steps:

preparing a Si substrate;

applying an insulating layer on the Si substrate;

sequentially applying a first conductive layer, a piezoelectric material layer and a second conductive layer on top of the Si substrate;

partially etching the second conductive layer and the piezoelectric material layer to form an upper electrode and a piezoelectric layer;

defining holes in the first conductive layer by etching; and forming a chamber under the first conductive layer, over the Si substrate and within the insulating layer, by etching the insulating layer through the holes in the first conductive layer.

2. The method as claimed in claim 1, wherein the method further comprises a lower electrode of the resonator forming step after the defining holes in the first conductive layer step, the first conductive layer is etched partially to form the lower electrode.

3. The method as claimed in claim 1, wherein the insulating layer is a $SiO_2$ material and a thickness of the insulating layer is 1000~10000 angstrom.

4. The method as claimed in claim 1, wherein the first metal layer is an Au, Mo, or Al material and a thickness of the first metal layer is 1000~10000 angstrom.

5. The method as claimed in claim 1, wherein the piezoelectric layer is an AlN material and a thickness of the first metal layer is 0.5~5 $\mu$m.

6. The method as claimed in claim 5, wherein the piezoelectric layer is a ZnO material.

7. The method as claimed in claim 1, wherein the second metal layer is an Au, Mo or Al material and a thickness of the first metal layer is 1000~10000 angstrom.

* * * * *